(12) United States Patent
Izawa et al.

(10) Patent No.: US 8,495,815 B2
(45) Date of Patent: Jul. 30, 2013

(54) ELECTROMAGNETIC SHIELDING METHOD AND ELECTROMAGNETIC SHIELDING FILM

(75) Inventors: Koichi Izawa, Tokyo (JP); Yumi Ogura, Kanagawa (JP)

(73) Assignee: Sony Mobile Communications, Inc., Tokyo (JP)

( * ) Notice: Subject to any disclaimer, the term of this patent is extended or adjusted under 35 U.S.C. 154(b) by 328 days.

(21) Appl. No.: 12/780,030

(22) Filed: May 14, 2010

(65) Prior Publication Data
US 2010/0294559 A1 Nov. 25, 2010

(30) Foreign Application Priority Data

May 22, 2009 (JP) ................ P2009-123715
Jun. 10, 2009 (JP) ................ P2009-138978
Nov. 18, 2009 (JP) ................ P2009-262700

(51) Int. Cl.
*H05K 3/06* (2006.01)
*H05K 9/00* (2006.01)
*B32B 37/00* (2006.01)

(52) U.S. Cl.
USPC ............ 29/830; 29/848; 29/855; 29/860; 156/60; 156/84; 156/272.2; 156/272.4; 174/350; 174/353; 174/359; 174/378

(58) Field of Classification Search
USPC ........... 29/874, 829, 830–852; 156/84, 85, 156/60, 272.2–273.9; 174/50.61, 50.64, 378, 174/50.51, 350, 353, 359
See application file for complete search history.

(56) References Cited

U.S. PATENT DOCUMENTS

| 5,491,301 A * | 2/1996 | Akiba et al. ............ 174/250 |
| 6,238,515 B1 * | 5/2001 | Tsujimoto et al. ........ 156/379.8 |
| 6,825,249 B1 * | 11/2004 | Takeda et al. ............ 523/218 |
| 7,312,400 B2 * | 12/2007 | Ito et al. ............ 174/250 |
| 8,153,909 B2 * | 4/2012 | Katagiri et al. ............ 174/262 |
| 2001/0025888 A1 * | 10/2001 | Kakinoki ............ 235/492 |

(Continued)

FOREIGN PATENT DOCUMENTS

EP 0 806 891 11/1997
JP 5-304387 11/1993

(Continued)

OTHER PUBLICATIONS

Search Report issued in corresponding European application No. 10163014.

*Primary Examiner* — Peter DungBa Vo
*Assistant Examiner* — Kaying Kue
(74) *Attorney, Agent, or Firm* — Frommer Lawrence & Haug LLP; William S. Frommer; Paul A. Levy

(57) ABSTRACT

An electromagnetic shielding method includes the steps of disposing a flexible electromagnetic shielding film including a laminate of at least an insulating layer and a conductive metal layer to cover a portion to be electromagnetically shielded on a printed wiring board so that the insulating layer faces the printed wiring board, the conductive metal layer having a higher melting temperature than that of the insulating resin layer; and heating the electromagnetic shielding film to a temperature to melt and contract the insulating layer, thereby bonding the conductive metal layer to a grounding conductor of the printed wiring board and electrically connecting the conductive metal layer to the grounding conductor. The heating temperature is higher than the melting temperature of the insulating layer and lower than the melting temperature of the conductive metal layer.

6 Claims, 13 Drawing Sheets

U.S. PATENT DOCUMENTS

| | | | |
|---|---|---|---|
| 2002/0029857 A1* | 3/2002 | Yamada | 156/556 |
| 2003/0006069 A1* | 1/2003 | Takebe et al. | 174/263 |
| 2004/0105223 A1* | 6/2004 | Okada et al. | 361/683 |
| 2004/0168824 A1* | 9/2004 | Sekido | 174/256 |
| 2005/0211464 A1* | 9/2005 | Byun et al. | 174/259 |
| 2005/0248909 A1* | 11/2005 | Kikuchi et al. | 361/309 |
| 2005/0276934 A1* | 12/2005 | Fukui et al. | 428/32.6 |
| 2006/0084254 A1* | 4/2006 | Attarwala | 438/584 |
| 2006/0152913 A1 | 7/2006 | Richey et al. | |
| 2007/0013067 A1* | 1/2007 | Nishida et al. | 257/737 |
| 2007/0095563 A1* | 5/2007 | Sekido | 174/256 |
| 2007/0120231 A1* | 5/2007 | Kobayashi et al. | 257/662 |
| 2007/0264496 A1 | 11/2007 | Arnold | |
| 2008/0176359 A1 | 7/2008 | Molkkari et al. | |
| 2008/0230254 A1* | 9/2008 | Kobayashi et al. | 174/117 FF |
| 2009/0236138 A1* | 9/2009 | Katagiri et al. | 174/262 |
| 2009/0289341 A1* | 11/2009 | Yamazaki et al. | 257/679 |

FOREIGN PATENT DOCUMENTS

| | | |
|---|---|---|
| JP | 6 289513 | 10/1994 |
| JP | 11 38172 | 2/1999 |
| WO | WO 99/57952 | 11/1999 |
| WO | WO 03/015487 | 2/2003 |

* cited by examiner

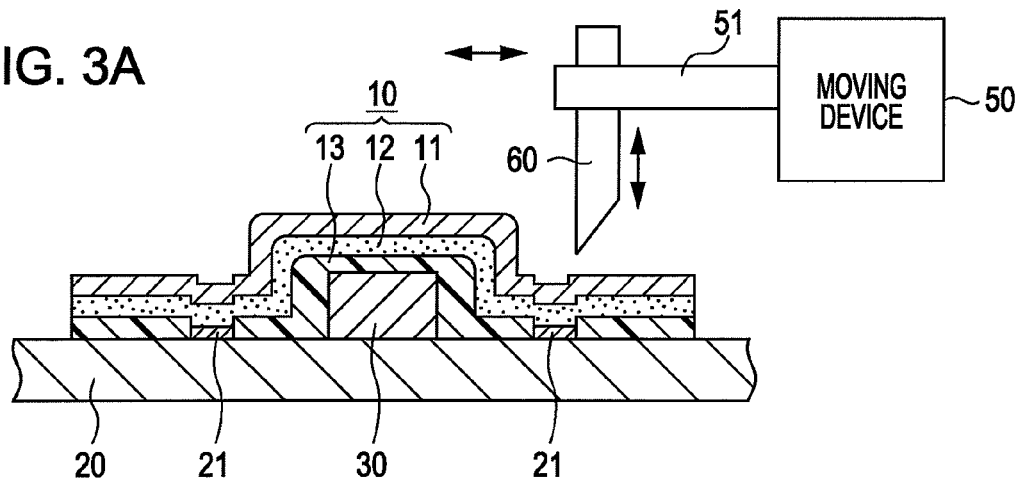
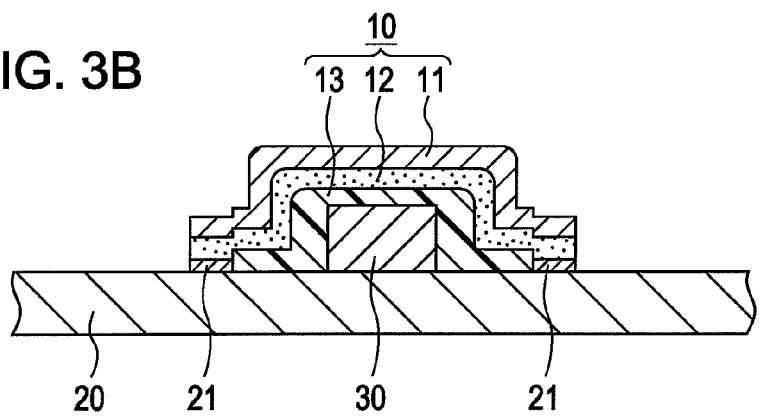
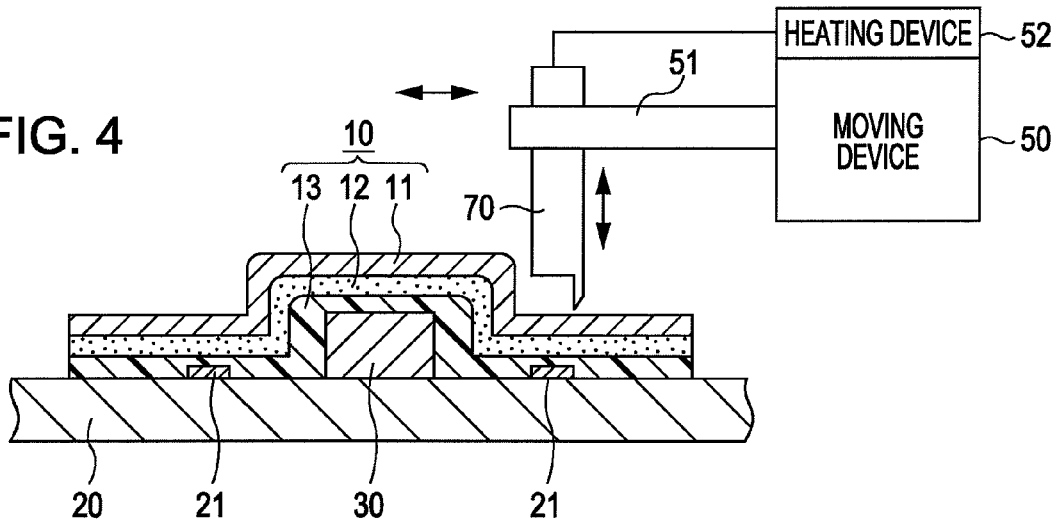

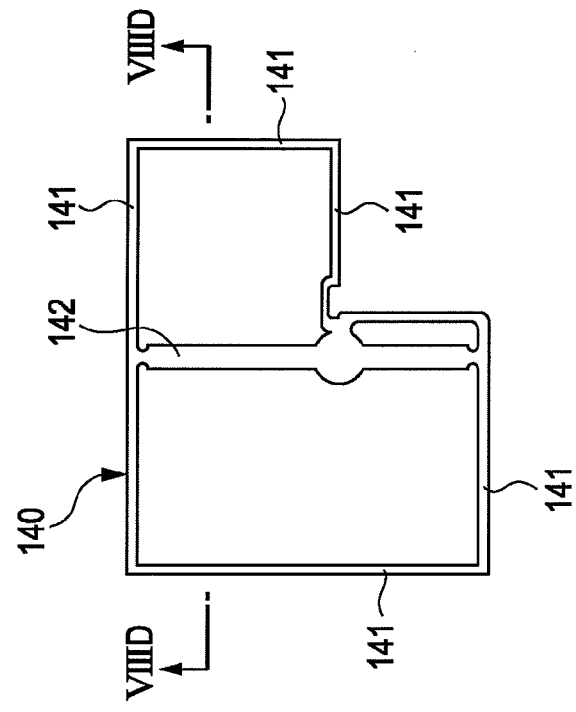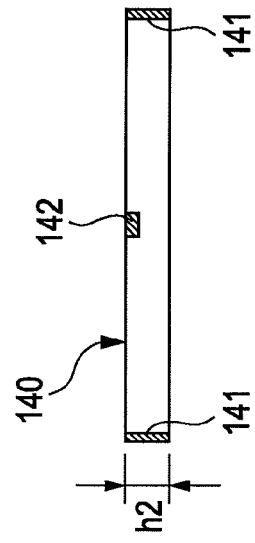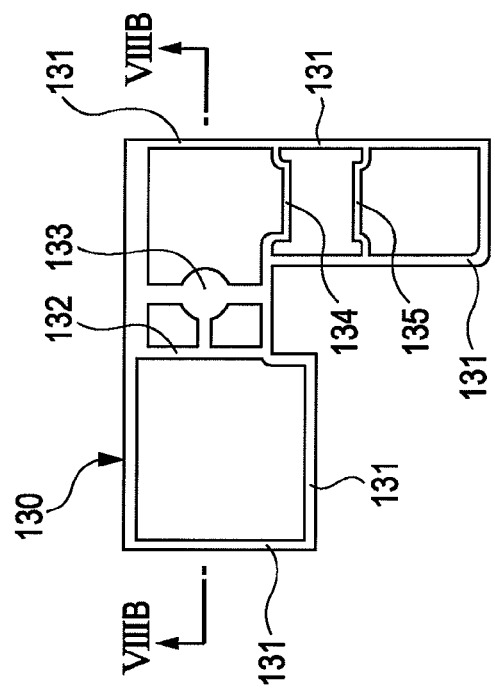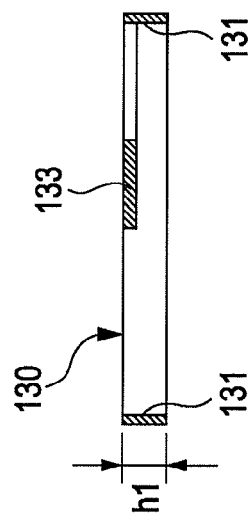

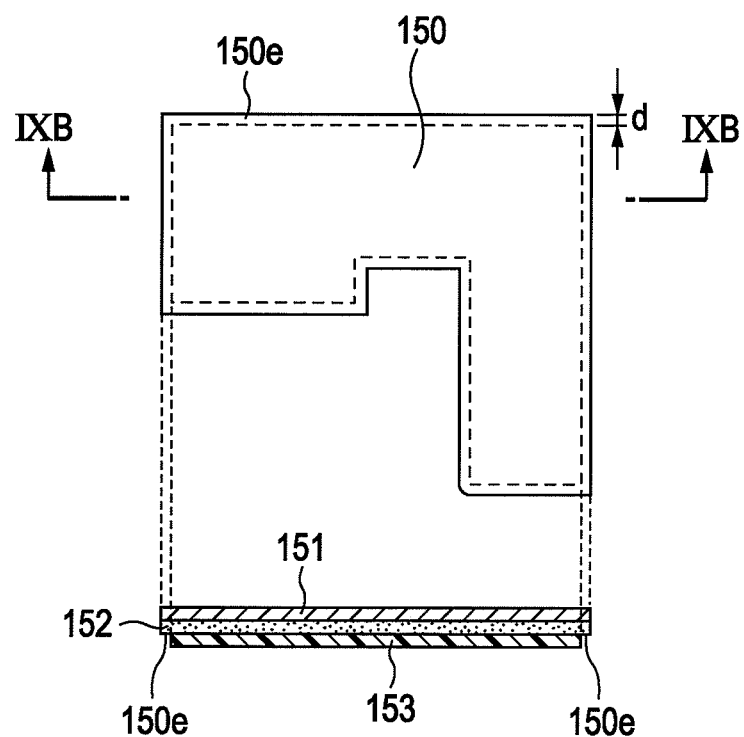
FIG. 9A
FIG. 9B
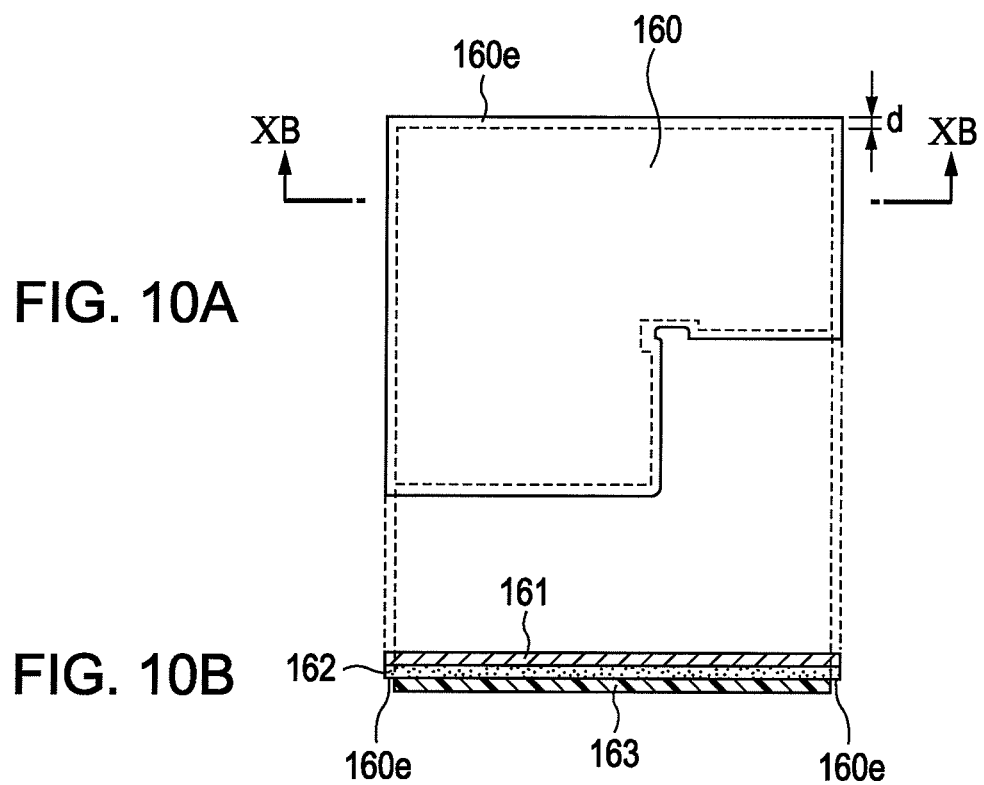
FIG. 10A
FIG. 10B

ELECTROMAGNETIC SHIELDING METHOD AND ELECTROMAGNETIC SHIELDING FILM

BACKGROUND OF THE INVENTION

1. Field of the Invention

The present invention relates to an electromagnetic shielding method for electronic components disposed on printed wiring boards and an electromagnetic shielding film used in the method.

2. Description of the Related Art

In order to prevent electromagnetic wave mutual interference of electronic parts disposed on printed wiring boards, can shields using metal thin plates are used. An example of the can shields is as follows.

First, a conductive frame member including a conductive metal thin plate is formed, using a mold, in a fence-like (wall-like) frame shape which has a constant height and surrounds a portion to be electromagnetically shielded on a printed wiring board. The conductive frame member is provided on the printed wiring board so as to surround the portion to be electromagnetically shielded. In this case, the conductive frame member is electrically grounded by soldering to a grounding conductor of the printed wiring board.

In addition, apart from the conductive frame member, a cover member made of a conductive metal thin plate is formed, using a mold, in a shape corresponding to the frame shape that surrounds the portion to be electromagnetically shielded on the printing wiring board so that the cover member is fitted to the conductive frame member. The cover member is fitted to the frame member provided on the printed wiring board. As a result, a can shield is formed to surround, by a conductor, the portion to be electromagnetically shielded on the printing wiring board.

Another example of the can shield uses a conductive case member formed by integrating the frame member and the cover member each including a conductive metal thin plate. In this example, the case member having an open side and made of a metal thin plate is formed using a mold. The conductive case member is disposed to cover a portion to be electromagnetically shielded so that the open side faces the printed wiring board. Then, the conductive case member and a grounding conductor of the printed wiring board are bonded to each other by soldering.

SUMMARY OF THE INVENTION

As described above, a frame member and a cover member each including a conductive metal thin plate and used for a can shield, and a case member including a metal thin plate are formed using molds.

However, for example, in electronic devices such as a cellular phone unit and the like, the molds cost, for example, about 20 millions yen, per model and are very expensive. In addition, the printed wiring boards used for respective electronic device models are different from each other, and the size and shape of a portion to be electromagnetically shielded change with changes of the printed wiring board. Therefore, the mold is ordered for each of the printed wiring boards, thereby causing the problem of enormous development costs.

In addition, the thickness of a metal plate of a can shield is, for example, about 0.2 mm, and thus interferes with thinning in development of portable electronic devices such as cellular phone units and the like which are intended to be thinner.

It is desirable to provide an electromagnetic shielding method which permits electromagnetic shielding capable of thinning without using a mold.

An electromagnetic shielding method according to an embodiment of the present invention includes the steps of disposing a flexible electromagnetic shielding film including a laminate of at least an insulating resin layer and a conductive metal layer to cover a portion to be electromagnetically shielded on a printed wiring board so that the insulating resin layer faces the printed wiring board, the conductive metal layer having a higher melting temperature than that of the insulating resin layer; and heating the electromagnetic shielding film to a temperature to melt and contract the insulating resin layer, thereby bonding the conductive metal layer to a grounding conductor of the printed wiring board and electrically connecting the conductive metal layer to the grounding conductor, the temperature being higher than the melting temperature of the insulating resin layer and lower than the melting temperature of the conductive metal layer.

In this configuration, electromagnetic shielding is realized by covering the portion to be electromagnetically shielded on the printed wiring board with the flexible electromagnetic shielding film. In this case, a frame member, a cover member, a case member, and the like are not formed using molds, and thus electromagnetic shielding is realized at very low cost. In addition, the electromagnetic shielding film may be thinned to be thinner than a metal of a can shield, thereby contributing to thinning of electronic devices.

An electromagnetic shielding method according to another embodiment of the present invention includes covering a portion to be electromagnetically shielded on a printed wiring board with a flexible electromagnetic shielding film which includes a conductive adhesive layer laminated and exposed in at least the peripheral edge of one of the surfaces of a conductive metal layer which has a shape corresponding to the portion to be electromagnetically shielded so that the electromagnetic shielding film is fixed to the printed wiring board with the conductive adhesive layer in the peripheral edge and is electrically connected to a grounding conductor of the printed wiring board.

An electromagnetic shielding method according to a further embodiment of the present invention includes the steps of disposing a frame member on a printed wiring board so that the frame member is electrically connected to a grounding conductor of the printed wiring board, the frame member being composed of a conductive material which surrounds a portion to be electromagnetically shielded on the printed wiring board; and bonding a flexible electromagnetic shielding film to the frame member with a conductive adhesive layer of the flexible electromagnetic shielding film to cover the portion to be electromagnetically shielded with the frame member and the flexible electromagnetic shielding film, the conductive adhesive layer being laminated and exposed in at least the peripheral edge of one of the surfaces of a conductive metal layer which has a shape corresponding to the portion to be electromagnetically shielded on the printed wiring board.

In the above-described configuration, similarly, electromagnetic shielding is realized by covering the portion to be electromagnetically shielded on the printed wiring board with the flexible electromagnetic shielding film. In this case, the conductive metal layer of the electromagnetic shielding film is electrically connected to the grounding conductor only by bonding the conductive metal layer to the printed wiring board with the exposed conductive adhesive layer, thereby realizing an electromagnetic shield. Therefore, there is the advantage of simplifying the steps for realizing an electromagnetic shield.

In addition, although the frame member composed of a conductive material such as a metal or the like is used, the electromagnetic shielding film is used instead of a usual cover member made of a metal. Therefore, the frame member is formed using a mold, while a mold for forming the cover member is not used. In view of the higher cost of the mold for the cover member, there is the effect decreasing the mold cost to a half or less.

Since the electromagnetic shielding film which may be thinner than metals is used instead of the metal-made cover member, the electromagnetic shielding film is made thinner than a metal of can shield, thereby contributing to thinning of electronic devices.

According to an embodiment of the present invention, electromagnetic shielding capable of thinning of electronic devices is provided at lower cost using a flexible electromagnetic shielding film.

BRIEF DESCRIPTION OF THE DRAWINGS

FIGS. 3A and 3B are drawings illustrating other steps of the electromagnetic shielding method according to the first embodiment of the present invention;

FIG. 4 is a drawing illustrating a modified example of the electromagnetic shielding method according to the first embodiment of the present invention;

FIGS. 8A to 8D are drawings illustrating examples of a conductive frame member used in the electromagnetic shielding method according to the fourth embodiment of the present invention;

FIGS. 9A and 9B are drawings illustrating an example of an electromagnetic shielding film used in the electromagnetic shielding method according to the fourth embodiment of the present invention;

FIGS. 10A and 10B are drawings illustrating another example of an electromagnetic shielding film used in the electromagnetic shielding method according to the fourth embodiment of the present invention;

DESCRIPTION OF THE PREFERRED EMBODIMENTS

Electromagnetic shielding methods according to embodiments of the present invention and electromagnetic shielding films used in the electromagnetic shielding methods are described with reference to the drawings.

[Electromagnetic Shielding Film According to First Embodiment (FIGS. 1A and 1B)]

Figure 1A:
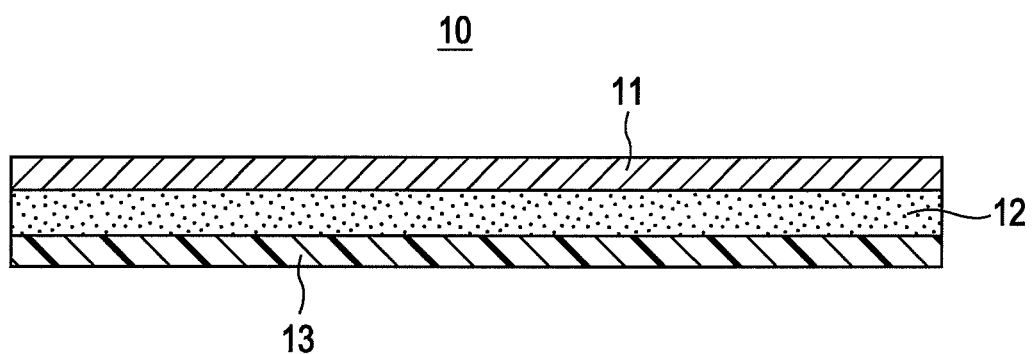
FIGS. 1A and 1B are cross-sectional views each illustrating an electromagnetic shielding film according to an embodiment of the present invention.

FIG. 1A is a cross-sectional view showing an electromagnetic shielding film 10 according to an embodiment of the present invention. As shown in FIG. 1A, the electromagnetic shielding film 10 according to this embodiment is a laminate film including a conductive metal layer 11 and an insulating layer, in this example, an insulating resin layer 13, which are laminated with a conductive adhesive layer 12 provided therebetween.

The conductive metal layer 11 is composed of, for example, an aluminum sheet. The melting temperature of the aluminum sheet is 600° C. or more.

The conductive adhesive layer 12 is composed of an epoxy resin containing metal fine particles. In this example, an acrylic conductive resin is used as the conductive adhesive layer 12. The melting temperature of the conductive metal layer 12 is lower than the melting temperature of the conductive metal layer 11, for example, about 100° C.

The insulating resin layer 13 is composed of, for example, PET (Polyethylene Terephthalate Resin) and is melted and contracted by heating. As a material of the insulating resin layer 13, a material having a melting temperature lower than that of the conductive metal layer 11 is used. In this example, the melting temperature of the insulating resin layer 13 is about 120° C. to 150° C., and a polyethylene resin is used as the insulating resin layer 13.

The insulating resin layer 13 may include a plurality of layers, not one layer.

The electromagnetic shielding film 10 according to the embodiment may be formed by, for example, applying the conductive adhesive layer 12 on the aluminum sheet constituting the conductive metal layer 11 and further forming the insulating resin layer 13 by, for example, evaporation or the like.

The thickness of the electromagnetic shielding film 10 according to the embodiment is 30 μm to 100 μm. Since the thickness of a metal plate of a can shield is 0.2 mm, the thickness of the electromagnetic shielding film 10 according to the embodiment is ½ or less of the metal plate of the can shield.

Figure 1B:
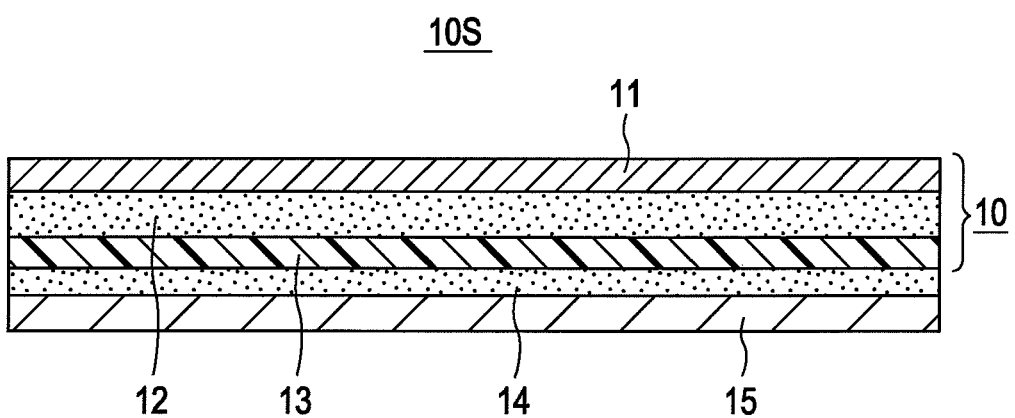

In addition, as shown in FIG. 1B, a conductive adhesive layer 14 may be further formed on the insulating resin layer 13 of the electromagnetic shielding film 10, and a release paper 15 may be bonded to the conductive adhesive layer 14. The electromagnetic shielding film 10S according to an embodiment shown in FIG. 1B is used by peeling the release paper 15 to expose the conductive adhesive layer 14 and bonding to an object with the exposed conductive adhesive layer 14.

The material of the conductive metal layer 11 is not limited to aluminum, and another metal may be used.

[Electromagnetic Shielding Method According to First Embodiment (FIGS. 2A to 2C, 3A, and 3B)]

FIGS. 2A to 2C, 3A, and 3B are drawings illustrating an electromagnetic shielding method according to the first embodiment using the above-described electromagnetic shielding film 10. These drawings are cross-sectional views of a printed wiring board 20 and the electromagnetic shielding film 10.

First Step

Figure 2A:
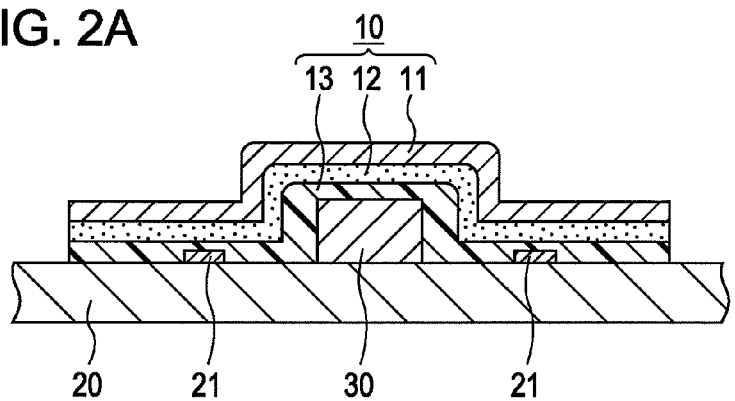
FIGS. 2A to 2C are drawings illustrating steps of an electromagnetic shielding method according to a first embodiment of the present invention.

In the electromagnetic shielding method according to the first embodiment, first, as shown in FIG. 2A, the electromagnetic shielding film 10 of the embodiment is disposed to cover a portion to be electromagnetically shielded on the printed wiring board 20. In this case, the electromagnetic shielding film 10 is disposed so that the insulating resin layer 13 faces the printed wiring board 20.

In this example, an electronic component 30 is disposed on the printed wiring board 20 to be connected to a conductive wiring pattern (not shown), and a grounding conductor pattern 21 is provided around the electronic component 30.

As shown in FIG. 2A, in this example, the electromagnetic shielding film 10 is disposed to cover an electronic component 30 in order to prevent electromagnetic wave mutual interference with the electronic component 30.

Second Step

Figure 2B:
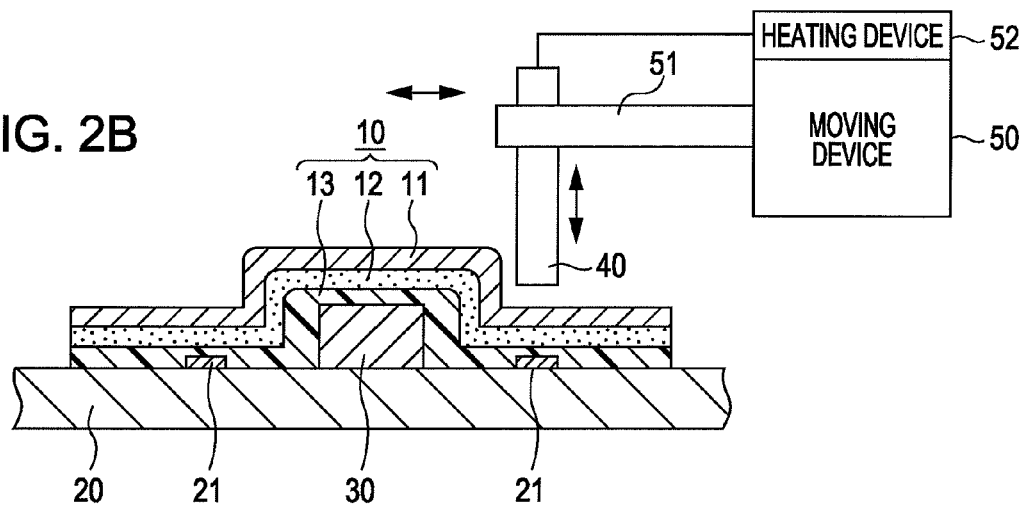
Figure 2C:
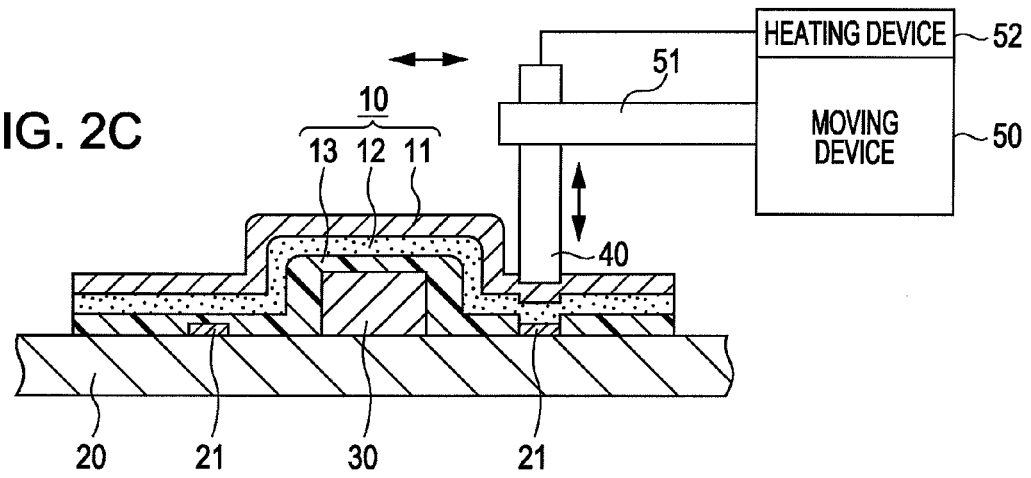

Next, as shown in FIGS. 2B and 2C, a thermocompression bonding bar 40 heated to a predetermined temperature is pressed on a grounding conductor pattern 21 of the printed wiring board 20 from the conductive metal layer 11 of the electromagnetic shielding film 10.

The heating temperature of the thermocompression bonding bar 40 is higher than the melting temperatures of the insulating resin layer 13 and the conductive adhesive layer 12 and lower than the melting temperature of the conductive metal layer 11, for example, about 150° C. to 170° C.

In this embodiment, a moving mechanism described below is used for moving the thermocompression bonding bar 40 under the above-described heating condition.

As shown in FIGS. 2B and 2C, in this embodiment, the thermocompression bonding bar 40 is provided to an arm 51 of a moving device 50 so as to be movable in the thickness direction of the printed wiring board 20 and movable in a plane parallel to a surface of the printed wiring board 20.

In addition, the thermocompression bonding bar 40 of this example is provided with, for example, a heater portion (not shown) so that the thermocompression bonding bar 40 is heated by supplying a current to the heater portion of the thermocompression bonding bar 40 from a heating device 52. The heating device 52 of this example is configured to be capable of controlling the temperature of the thermocompression bonding bar 40 by controlling the current supplied to the thermocompression bonding bar 40.

The moving device 50 of this example automatically moves the thermocompression bonding bar 40 provided at the end of the arm 51 on the basis of moving position setting information of an operator.

In this example, the moving device 50 is configured to store arrangement information of the grounding conductor pattern 21 on the printed wiring board 20 so that the information is displayed on a display screen provided in the moving device 50. The operator determines a moving path of the thermocompression bonding bar 40 on the grounding conductor pattern 21 around the electronic component 30 based on the arrangement information of the grounding conductor pattern 21 on the display screen.

Then, the operator moves the thermocompression bonding bar 40 to the starting point of the set moving path and moves the thermocompression bonding bar 40 downward so as to press the conductive metal layer 11 of the electromagnetic shielding film 10 to the grounding conductor pattern 21 of the printed wiring board 20. At this time, the temperature of the thermocompression bonding bar 40 is controlled to about 150° C. to 170° C. by the heating device 52.

Then, the operator instructs the moving device 50 to start movement of the thermocompression bonding bar 40 in the set moving path. As a result, the moving device 50 moves the thermocompression bonding bar 40 so as to trace the grounding conductor pattern 21 with the electromagnetic shielding film 10 pressed to the grounding conductor pattern 21 as shown in FIG. 2C.

When the thermocompression bonding bar 40 is moved, the insulating resin layer 13 is melted and contracted by heat in a portion of the electromagnetic shielding film 10 which is heated and pressed with the thermocompression bonding bar 40. Therefore, in the portion of the electromagnetic shielding film 10 which is heated and pressed with the thermocompression bonding bar 40, the insulating resin layer 13 is excluded by pressure of the thermocompression bonding bar 40, and the melted conductive adhesive layer 12 is bonded to the grounding conductor pattern 21. Consequently, the conductive metal layer 11 of the electromagnetic shielding film 10 is electrically connected to the grounding conductor pattern 21.

Therefore, the electromagnetic shielding film 10 is bonded to the printed wiring board 20 by trace-moving the thermocompression bonding bar 40 along the grounding conductor pattern 21, and the conductive metal layer 11 of the electromagnetic shielding film 10 is electrically connected to the grounding conductor pattern 21. As a result, electromagnetic shielding for the electronic component 30 is realized.

Third Step

Next, in this embodiment, as shown in FIG. 3A, a cutter 60 for cutting the electromagnetic shielding film 10 is attached to the arm 51 of the moving device 50 in place of the thermocompression bonding bar 40. In this case, the position of the arm 51 is finely controlled so that the edge of the cutter 60 is positioned outside a portion to be electromagnetically shielded at a bonded portion between the conductive metal layer 11 of the electromagnetic shielding film 10 and the grounding conductor pattern 21.

Then, the operator instructs the moving device 50 to move the cutter 60 downward so that the edge thereof is positioned at a cutting position of the electromagnetic shielding film 10 and move the cutter 60 to trace the grounding conductor pattern 21 like in the case of the thermocompression bonding bar 40.

As a result, as shown in FIG. 3B, an excess portion of the electromagnetic shielding film 10 is cut off. Thus, electromagnetic shielding of a portion including the electronic component 30 is completed.

In the first embodiment, the case using the electromagnetic shielding film 10 having the configuration shown in FIG. 1A is described. However, in the first embodiment, electromagnetic shielding may be realized using the electromagnetic shielding film 10S having the configuration shown in FIG. 1B.

Namely, when the electromagnetic shielding film 10S having the configuration shown in FIG. 1B is used, in the first step, the conductive adhesive layer 14 is exposed by removing the release paper 15. Then, the electromagnetic shielding film 10S is disposed to cover a portion to be electromagnetically shielded on the printed wiring board 20. In this case, the electromagnetic shielding film 10S is temporarily fixed to the printed wiring board 20 by bonding with the conductive adhesive layer 14.

In this state, the second step is carried out by the same method as in the case of the above-described electromagnetic shielding film 10. Thus, in a portion of the electromagnetic shielding film 10S which is heated and pressed with the thermocompression bonding bar 40, the insulating resin layer 13 is melted and contracted and is excluded by pressure of the thermocompression bonding bar 40, and the melted conductive adhesive layer 12 is bonded to the grounding conductor pattern 21 through the conductive adhesive layer 14. As a result the conductive metal layer 11 of the electromagnetic shielding film 10S is electrically connected to the grounding conductor pattern 21.

In the case of the electromagnetic shielding film 10S, the third step is performed by the same method as described above.

The case of the electromagnetic shielding film 10S has the effect of facilitating treatments in the second and third steps because the electromagnetic shielding film 10S is temporarily fixed to the printed wiring board 20 by the presence of the conductive adhesive layer 14.

In this embodiment, the step (second step) of bonding the conductive metal layer 11 of the electromagnetic shielding film 10 to the grounding conductor pattern 21 of the printed wiring board 20 and the step (third step) of removing an excess portion of the electromagnetic shielding film 10 are separated from each other.

However, the above-described two steps may be combined as one step by using a thermocompression bonding bar 70 with a cutter as shown in FIG. 4 in place of the thermocompression bonding bar 40. In other words, the thermocompression bonding bar 70 with a cutter permits cutting out of an excess portion of the electromagnetic shielding film 10 while performing bonding and electric connection between the conductive metal layer 11 of the electromagnetic shielding film 10 and the grounding conductor pattern 21 of the printed wiring board 20.

When there occurs no problem in covering a portion other than the portion to be electromagnetically shielded on the printed wiring board 20 with the electromagnetic shielding film 10, the third step of cutting off an excess portion of the electromagnetic shielding film 10 shown in FIG. 3B may be omitted.

In the first embodiment, the thermocompression bonding bar 40 is moved to trace the grounding conductor pattern 21 so that the electromagnetic shielding film 10 or 10S is continuously bonded to the printed wiring board 20 with the conductive adhesive layer 12 of the electromagnetic shielding film 10 or 10S. However, the thermocompression bonding bar 40 may be pressed on the electromagnetic shielding film 10 at separate positions on the grounding conductor pattern 21 so that the conductive metal layer 11 of the electromagnetic shielding film 10 is bonded and electrically connected to the grounding conductor pattern 21 of the printed wiring board 20 at the separate positions.

[Electromagnetic Shielding Method According to Second Embodiment (FIGS. 5A and 5B)]

In the second embodiment, the heating method for melting an insulating resin layer 13 of an electromagnetic shielding film 10 or 10S is different from in the first embodiment.

Figure 5A:
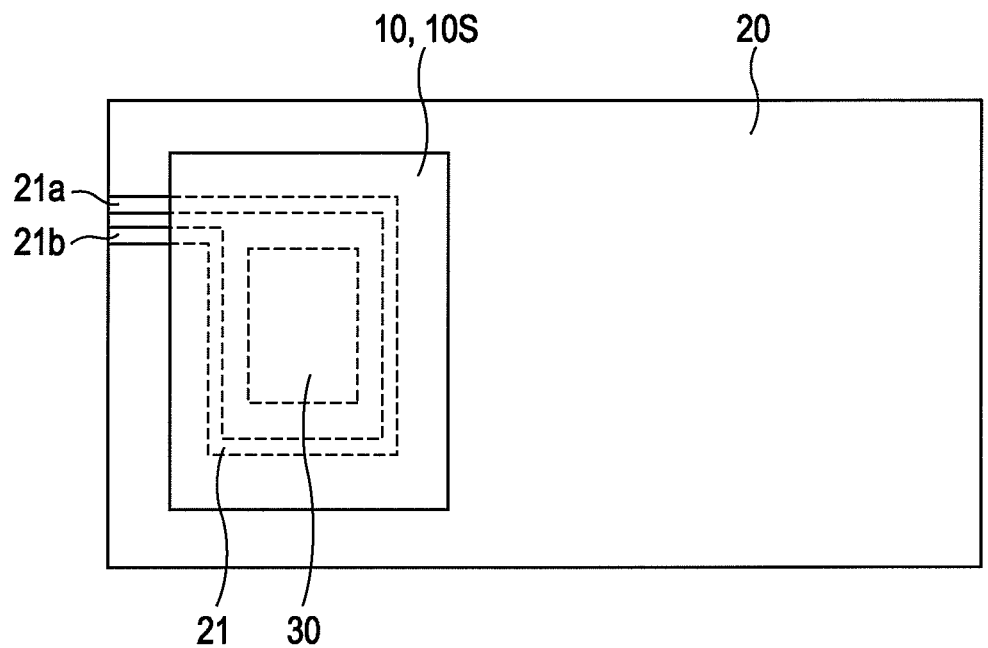
FIGS. 5A and 5B are drawings illustrating steps of an electromagnetic shielding method according to a second embodiment of the present invention.
Figure 5B:
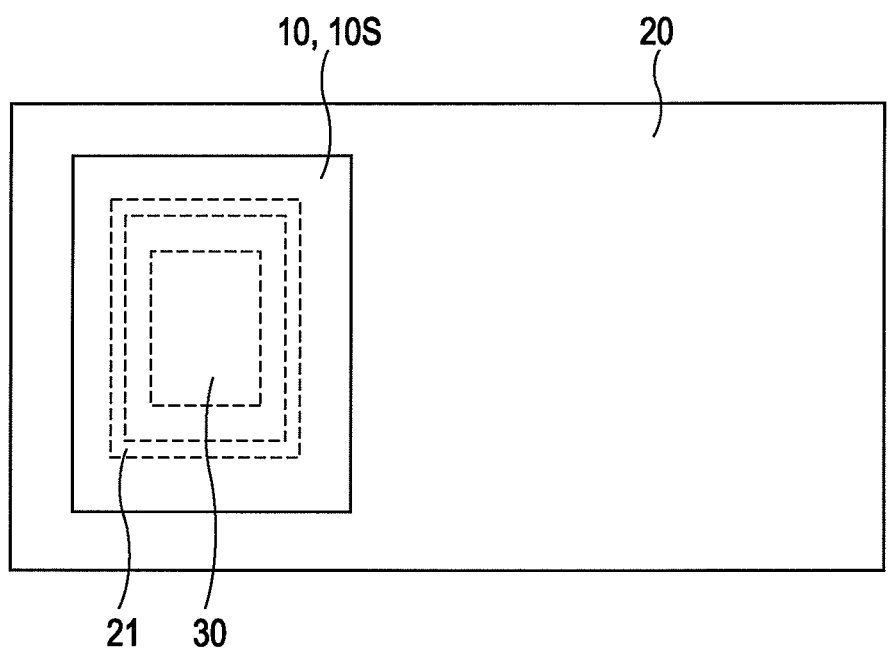

FIGS. 5A and 5B are drawings each illustrating a principal portion of an electromagnetic shielding method according to the second embodiment. Each of these figures is a top view of a printed wiring board 20 as viewed from a surface on which an electronic component 30 is mounted.

In the second embodiment, as shown in FIG. 5A, the electronic component 30 is disposed on the printed wiring boar 20, and a grounding conductor pattern 21 is formed around the electronic component 30 so as to surround the electronic component 30.

Like in the first embodiment, in the first step, the electromagnetic shielding film 10 is disposed to cover a portion to be electromagnetically shielded on the printed wiring board 20 so that the insulating resin layer 13 faces the printed wiring board 20. Namely, as shown in FIG. 5A, the electromagnetic shielding film 10 is disposed on the printed wiring board 20 so as to cover the electronic component 30 and the grounding conductor pattern 21 formed around the electronic component 30.

In this case, when the electromagnetic shielding film 10S is used, as shown in FIG. 5A, the electromagnetic shielding film 10S may be temporarily fixed to cover the electronic component 30 and the grounding conductor pattern 21 formed around the electronic component 30.

Then, in the second embodiment, in the second step, a voltage is applied between both ends 21a and 21b of the grounding conductor pattern 21 so that a DC current or AC current flows through the grounding conductor pattern 21.

As a result, Joule heat is generated in the grounding conductor pattern 21. In this embodiment, the supplied current value and supply time are controlled so that the heating temperature of the grounding conductor pattern 21 is, for example, about 150° C. to 170° C.

In the second step of the second embodiment, the insulating resin layer 13 of the electromagnetic shielding film 10 (or 10S) is melted and contracted by the heat generated in the grounding conductor pattern 21. Therefore, in a portion of the electromagnetic shielding film 10 (or 10S) which is heated and pressed with the thermocompression bonding bar 40, the insulating resin layer 13 is excluded by pressure of the thermocompression bonding bar 40, and the melted conductive adhesive layer 12 is bonded to the grounding conductor pattern 21. As a result, the conductive metal layer 11 of the electromagnetic shielding film 10 (or 10S) is electrically connected to the grounding conductor pattern 21.

In the second embodiment, the thermocompression bonding bar 40 may be attached to the arm of the moving device 50 and moved to trace the grounding conductor pattern 21 so that the electromagnetic shielding film 10 (or 10S) is pressed on the printed wiring board 20.

In the second embodiment, in the same third step as in the first embodiment, an extra portion of the electromagnetic shielding film 10 (or 10S) outside the grounding conductor pattern 21 is removed with the cutter 60.

In the second embodiment, in the second step, a compression bonding bar with a cutter having the same shape as the thermocompression bonding bar 70 with a cutter in the first embodiment may be used for pressing the electromagnetic shielding film 10 (or 10S) to trace the conductor pattern and removing an extra portion with the bonding bar.

In the second embodiment, the grounding conductor pattern 21 may be a ring pattern as shown in FIG. 5B. In this case, an induced current may be passed through the ring-shaped grounding conductor pattern 21 by electromagnetic induction. However, in this case, it is desirable that other electronic components are not influenced by electromagnetic induction.

[Electromagnetic Shielding Method According to Third Embodiment (FIG. 6)]

Figure 6:
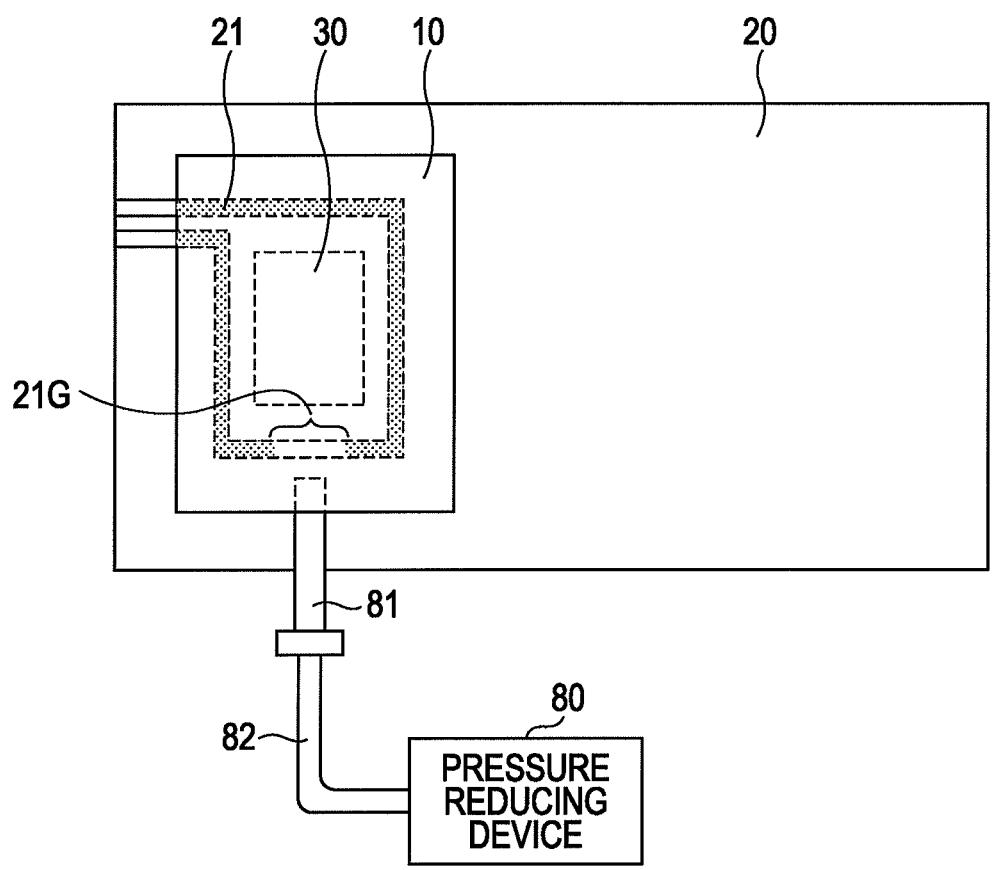
FIG. 6 is a drawing illustrating a step of an electromagnetic shielding method according to a third embodiment of the present invention.

In the third embodiment, basically, a conductive adhesive layer 12 of an electromagnetic shielding film 10 is bonded to a grounding conductor pattern of a printed wiring board 20 by the same method as in the first or second embodiment. However, in the third embodiment, as shown in FIG. 6, the whole conductive adhesive layer 12 of the electromagnetic shielding film 10 is bonded to the grounding conductor pattern of the printed wiring board 20, leaving an unbonded portion 21G.

Then, a suction jig 81 is attached to the unbonded portion 21G serving as an opening in order to suck air in an electromagnetic shield portion covered with the electromagnetic shielding film 10.

The suction jig 81 is connected to a pressure reducing device 80 including a vacuum pump or the like, for example, through a rubber tube 82.

In the third embodiment, the pressure in the electromagnetic shield portion covered with the electromagnetic shielding film 10 is reduced by the pressure reducing device 80. As a result, the electromagnetic shielding film 10 is closely adhered to a portion to be electromagnetically shielded. In the third embodiment, the unbonded portion 21G is pressure-bonded with the thermocompression bonding bar 40 to close the opening while the pressure is reduced by the pressure reducing device 80.

According to the third embodiment, the electromagnetic shield portion is further thinned.

[Advantage of First to Third Embodiments]

According to the first to third embodiments, unlike in usual can shields, a mold is not used for an electromagnetic shield, but the electromagnetic shielding film 10 or 10S which is easy to produce is used instead, thereby significantly decreasing the cost.

The above-described embodiments have high versatility and the advantage of decreasing the number of components used.

In addition, the thickness of the electromagnetic shielding film 10 or 10S may be ½ or less the thickness of a metal thin plate material of usual can shields, thereby permitting further thinning of electronic devices provided with printed wiring boards, such as cellular phone units and the like.

[Modified Example of First to Third Embodiments]

In the first to third embodiments, the electromagnetic shielding film includes the three layers, i.e., the conductive metal layer, the conductive adhesive layer, and the insulating layer. However, the electromagnetic shielding film may basically include two layers, i.e., the conductive metal layer and the insulating layer. When this type of two-layer electromagnetic shielding film is used, in the electromagnetic shielding method according to any one of the first to third embodiments, an adhesive composed of, for example, the same material as the conductive adhesive layer 12 may be preferably applied to the grounding conductor pattern 21.

Although, in the above-described embodiments, the insulating layer is the insulating resin layer, the insulating layer is not limited to the insulating resin layer, and any one of various insulating materials may be used as long as flexibility of the electromagnetic shielding film is maintained, and the above-described condition of the melting temperature is satisfied.

In addition, the conductive adhesive layer 12 is melted together with the insulating resin layer and bonded to the conductor portion of the printed wiring board. However, when a conductive adhesive capable of bonding without being melted is used, melting is not performed.

[Electromagnetic Shielding Method According to Fourth Embodiment]

Among a conductive frame member and a cover member each including a metal thin plate in a usual can shield, the fourth embodiment uses the conductive frame member but uses an electromagnetic shielding film instead of the cover member including a metal thin plate.

Figure 7:
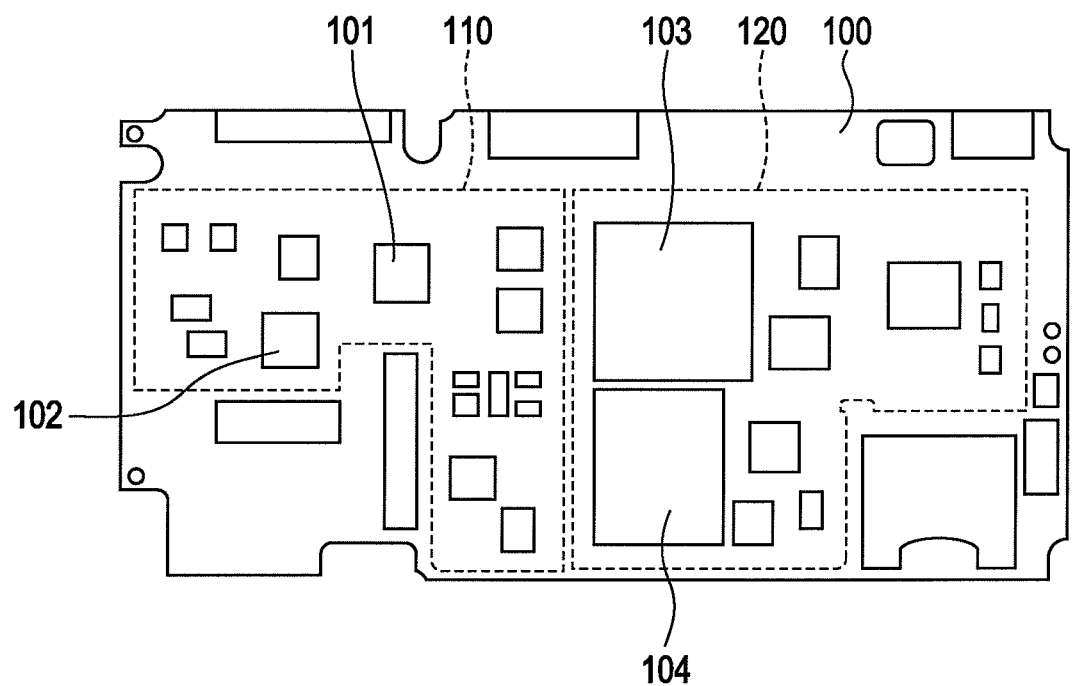
FIG. 7 is a drawing illustrating a step of an electromagnetic shielding method according to a fourth embodiment of the present invention.

FIG. 7 is a top plan view of a printed wiring board 100 of an electronic device, as viewed from a surface on which electronic components 101, 102, 103, 104, ..., such as IC and the like, are mounted. FIG. 7 is a drawing before electromagnetic shielding is performed for a portion to be electromagnetically shielded, including the electronic components mounted on the printed wiring board 100. In an example shown in FIG. 7, the portion to be electromagnetically shielded includes two regions (hereinafter referred to as "electromagnetic shield regions") 110 and 120 each surrounded by a dotted line.

In the fourth embodiment, conductive frame members 130 and 140 each composed of a metal thin plate used for constituting a can shield are formed for the two electromagnetic shield regions 110 and 120, respectively, using molds as shown in FIGS. 8A and 8B and FIGS. 8C and 8D.

The conductive frame member 130 shown in FIGS. 8A and 8B is adapted for the electromagnetic shield region 110, FIG. 8A is a top view, and FIG. 8B is a sectional view taken along line VIIIB-VIIIB in FIG. 8A. As shown in FIGS. 8A and 8B, the conductive frame member 130 includes a frame wall portion 131 which stands vertically on the surface of the printed wiring board 100 when provided on the printed wiring board 100, and reinforcing bridging portions 132, 133, 134, and 135 for reinforcing the frame wall portion 131 which surrounds the electromagnetic shield region 110.

The reinforcing bridging portions 132, 133, 134, and 135 are formed by bridging separate positions of the frame member 131 using a metal thin plate on the upper end side opposite to the bonded portion between the frame wall portion 131 and the printed wiring board 100.

In addition, the height h1 of the frame wall portion 131 of the conductive frame member 130 from the printed wiring board 100 is set to be equal to or slightly larger than the total of the height, from the printed wiring board 100, of the highest one among the electronic components 101, 102, ... in the electromagnetic shield region 110, and the thickness of the reinforcing bridge portions 132, 133, 134, and 135.

In other words, the height h1 is such a height that when the conductive frame member 130 is covered with a plane in contact with the upper end of the frame wall portion 131, the plane does not contact the electronic components 101, 102, ... in the electromagnetic shield region 110.

Similarly, the conductive frame member 140 shown in FIGS. 8C and 8D is adapted for the electromagnetic shield region 120, FIG. 8C is a top view, and FIG. 8D is a sectional view taken along line VIIID-VIIID in FIG. 8C. As shown in FIGS. 8C and 8D, the conductive frame member 140 includes a frame wall portion 141 which stands vertically on the surface of the printed wiring board 100 when provided on the printed wiring board 100, and a reinforcing bridging portion 142 for reinforcing the frame wall portion 141 which surrounds the electromagnetic shield region 111.

The reinforcing bridging portion 142 is formed by bridging separated positions of the frame wall portion 141 using a metal thin plate on the upper end side opposite to the bonded portion between the frame wall portion 141 and the printed wiring board 100.

In addition, the height h2 of the frame wall portion 141 of the conductive frame member 140 from the printed wiring board 100 is set to be equal to or slightly larger than the total of the height, from the printed wiring board 100, of the highest one among the electronic components 103, 104, ... in the electromagnetic shield region 120, and the thickness of the reinforcing bridge portion 142.

In other words, the height h2 is such a height that when the conductive frame member 140 is covered with a plane in contact with the upper end of the frame wall portion 141, the plane does not contact the electronic components 103, 104, ... in the electromagnetic shield region 120.

<Configuration Example of Electromagnetic Shielding Film Used in Fourth Embodiment>

As described above, the fourth embodiment does not use a cover member made of a metal thin plate formed using a mold for each of the conductive frame members 130 and 140. Instead, the same electromagnetic shielding film as in the above-described embodiments is used. The electromagnetic shielding film used in the fourth embodiment is described.

FIGS. 9A and 9B show an electromagnetic shielding film 150 alternative to a cover member for the conductive frame member 130 for the electromagnetic shield region 110, in which FIG. 9A is a plan view, and FIG. 9B is a sectional view taken along line IXB-IXB in FIG. 9A.

FIGS. 10A and 10B show an electromagnetic shielding film 160 alternative to a cover member for the conductive frame member 140 for the electromagnetic shield region 120, in which FIG. 10A is a plan view, and FIG. 10B is a sectional view taken along line XB-XB in FIG. 10A.

In this example, as shown in FIG. 9A, the electromagnetic shielding film 150 is formed in a planar shape corresponding to the shape of the electromagnetic shield region 110 of the printed wiring board 100. In addition, as shown in FIG. 10A, the electromagnetic shielding film 160 is formed in a planar shape corresponding to the shape of the electromagnetic shield region 120 of the printed wiring board 100.

On the other hand, the sectional shapes of the electromagnetic shielding films 150 and 160 have the same configuration. Namely, like the electromagnetic shielding film 10 shown in FIG. 1A, each of the electromagnetic shielding films 150 and 160 is a laminate film including a conductive metal layer 151 or 161 and an insulating layer, in this example, an insulating resin layer 153 or 163, which are laminated with a conductive adhesive layer 152 or 162 provided therebetween.

However, the insulating resin layers 153 and 163 are not laminated to expose the conductive adhesive layers 152 and 162 in peripheral portions 150e and 160e of the electromagnetic shielding films 150 and 160 shown by dotted lines in FIGS. 9A and 10A, respectively. The width d of the peripheral portions 150e and 160e in which the conductive adhesive layers 152 and 162 are respectively exposed corresponds to or is slightly larger than the width of the upper end surfaces of the frame wall portions 131 and 141 of the conductive frame members 130 and 140.

The width d of the peripheral portions 150e and 160e in which the conductive adhesive layers 152 and 162 are respectively exposed may be smaller than the width of the upper end surfaces of the frame wall portions 131 and 141 of the conductive frame members 130 and 140 as long as the conductive frame members 130 and 140 are sufficiently bonded to the electromagnetic shielding films 150 and 160 on the upper end surfaces of the conductive frame members 130 and 140, respectively.

The conductive metal layers 151 and 161 are composed of, for example, an aluminum sheet. The conductive adhesive layers 152 and 162 are composed of an epoxy resin containing metal fine particles. The insulating resin layers 153 and 163 are composed of, for example, PET (Polyethylene Terephthalate Resin).

In this embodiment, the thickness of the electromagnetic shielding films 150 and 160 may be 30 μm to 100 μm. Since the thickness of the cover member made of a metal thin plate of a can shield is 0.2 mm, the thickness of the electromagnetic shielding films 150 and 160 according to this embodiment is ½ or less of the cover member made of the metal thin plate of the can shield.

In this example, the conductive adhesive layers 152 and 162 are layers composed of an adhesive which is bondable at room temperature. Therefore, the electromagnetic shielding films 150 and 160 are provided in a state of being bonded to release paper with the conductive adhesive layers 152 and 162, respectively. The electromagnetic shielding films 150 and 160 are used by peeling from the release paper.

First Step

In the fourth embodiment, the conductive frame members 130 and 140 previously formed using molds as described above are mounted on the printed wiring board 100 so as to fit the shapes of the electromagnetic shield regions 110 and 120, respectively, of the printed wiring board 100. A mounting state is shown in FIGS. 11A and 11B.

Figure 11A:
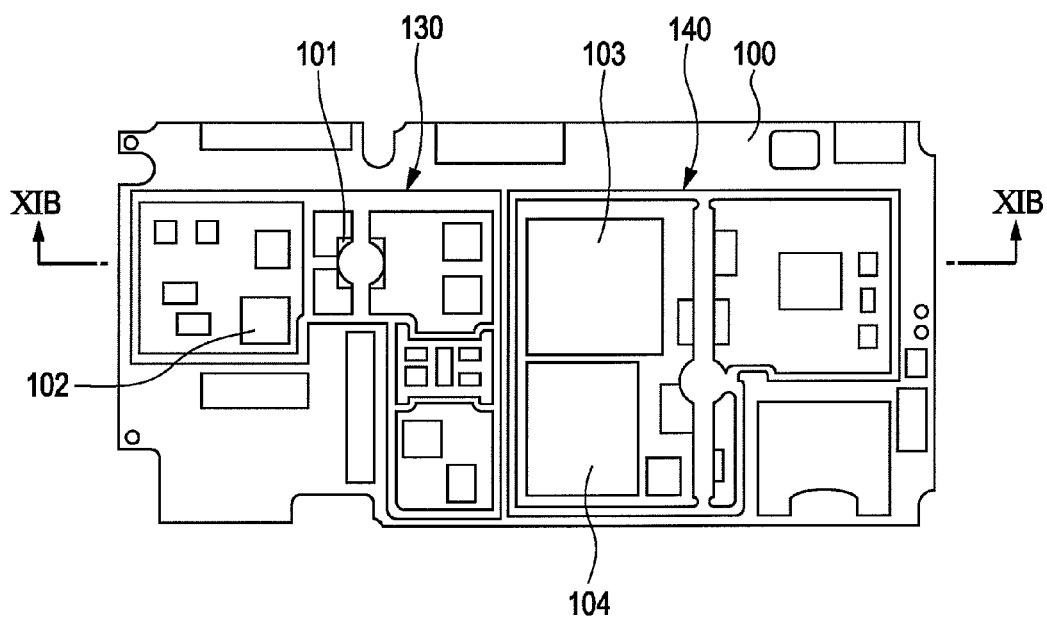
FIGS. 11A and 11B are drawings illustrating a step of the electromagnetic shielding method according to the fourth embodiment of the present invention.
Figure 11B:
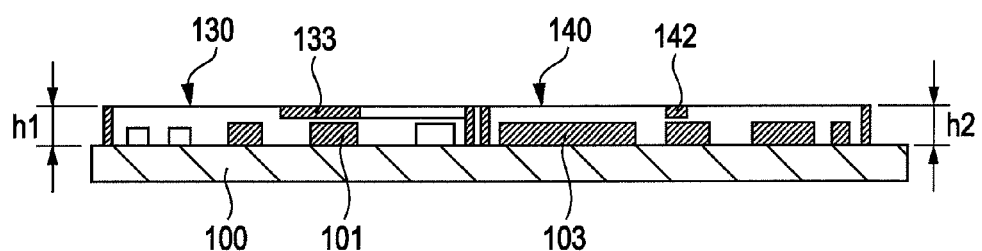

FIG. 11A is a top plan view of the printed wiring board 100 as viewed from the surface on which the electronic components 101, 102, 103, 104, . . . , such as IC and the like, are mounted. FIG. 11B is a sectional view taken along line XIB-XIB in FIG. 11A.

In this case, although not shown in the drawings, a grounding conductor pattern is formed along each of the electromagnetic shield regions 110 and 120 on the printed wiring board 100. The conductive frame members 130 and 140 are bonded and electrically grounded by soldering to the respective grounding conductor patterns of the printed wiring board 100 at the bonded end surfaces between the frame wall portions 131 and 141 and the printed wiring board 100. As a result, the first step is completed.

Second Step

Figure 12A:
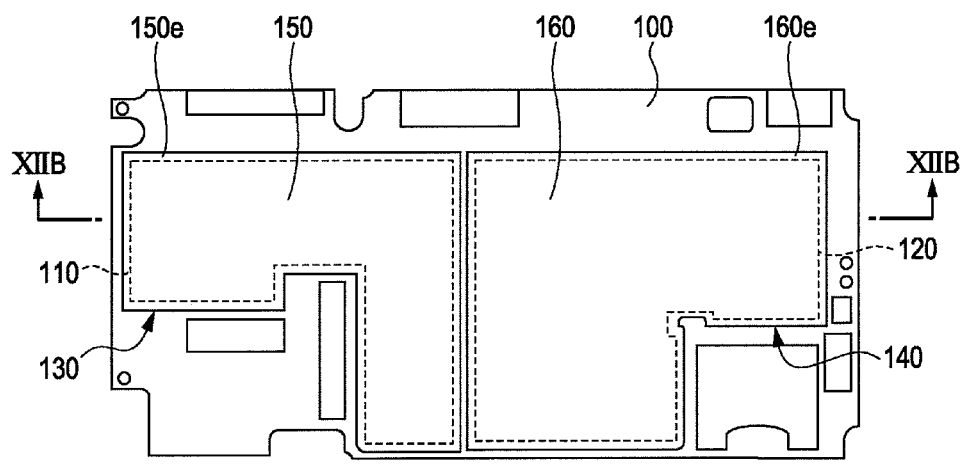
FIGS. 12A and 12B are drawings illustrating a step of the electromagnetic shielding method according to the fourth embodiment of the present invention.
Figure 12B:
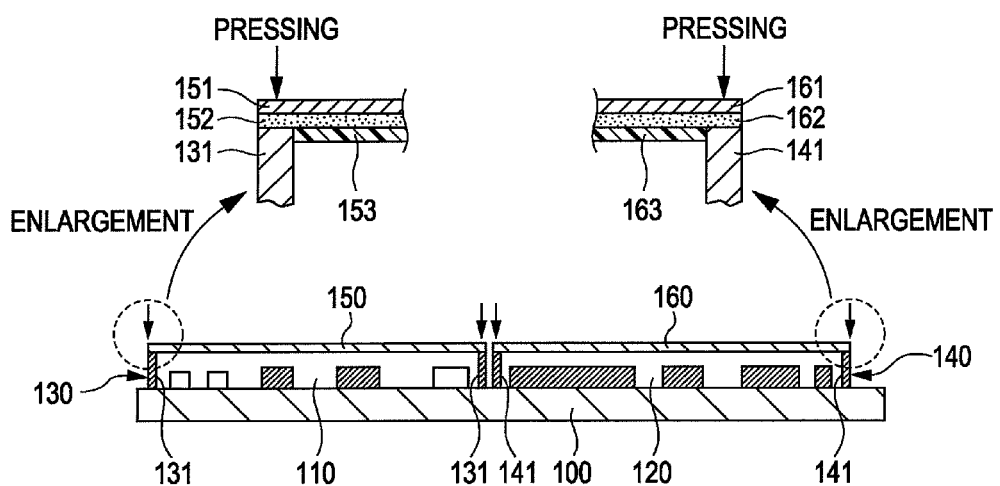

In the second step, first, the electromagnetic shielding film 150 separated from the release paper is placed on the conductive frame member 130 so that the peripheral portion 150e in which the conductive adhesive layer 152 is exposed contacts the upper end surface of the frame wall portion 131 of the conductive frame member 130 as shown in FIGS. 12A and 12B and further in an enlarged partial view of FIG. 12B.

Next, the peripheral portion 150e of the electromagnetic shielding film 150 in which the conductive adhesive layer 152 is exposed in contact with the upper end surface of the frame wall portion 131 of the conductive frame member 130 is pressed on the upper end surface of the frame wall portion 131 of the conductive frame member 130 as shown by an arrow in FIG. 12B, thereby bonding the electromagnetic shielding film 150 to the upper end surface of the frame wall portion 131 of the conductive frame member 130.

Therefore, the electromagnetic shielding film 150 is electrically connected to the conductive frame member 130 which is electrically connected to a grounding conductor of the printed wiring board 100. As a result, the electromagnetic shield region 110 of the printed wiring board 100 is covered with the electromagnetic shielding film 150 and the conductive frame member 130 electrically connected to the grounding conductor of the printed wiring board 100, thereby realizing an electromagnetic shield.

Similarly, the electromagnetic shielding film 160 separated from the release paper is placed on the conductive frame member 140 so that the peripheral portion 160e in which the conductive adhesive layer 162 is exposed contacts the upper end surface of the frame wall portion 141 of the conductive frame member 140 as shown in FIGS. 12A and 12B and further in an enlarged partial view of FIG. 12B.

Next, the peripheral portion 160e of the electromagnetic shielding film 160 in which the conductive adhesive layer 162 is exposed in contact with the upper end surface of the frame wall portion 141 of the conductive frame member 140 is pressed on the upper end surface of the frame wall portion 141 of the conductive frame member 140, thereby bonding the electromagnetic shielding film 160 to the upper end surface of the frame wall portion 141 of the conductive frame member 140.

Therefore, the electromagnetic shielding film 160 is electrically connected to the conductive frame member 140 which is electrically connected to a grounding conductor of the printed wiring board 100. As a result, the electromagnetic shield region 120 of the printed wiring board 100 is covered with the electromagnetic shielding film 160 and the conductive frame member 140 electrically connected to the grounding conductor of the printed wiring board 100, thereby realizing an electromagnetic shield.

<Modified Example 1 of Fourth Embodiment (FIGS. 13A and 13B)>

In the above-described fourth embodiment, the insulating layers (insulating resin layers 153 and 163) are laminated on the conductive adhesive layers 152 and 162 of the electromagnetic shielding films 150 and 160, excluding the peripheral portions 150e and 160e, respectively. Even when conductors likely to be in contact with the electromagnetic shielding films 150 and 160 are present in the electromagnetic shield regions 110 and 120 of the printed wiring board 100, insulation between the conductors and the conductive metal layers 151 and 161 of the electromagnetic shielding films 150 and 160 is secured by the insulating layers.

Figure 13A:
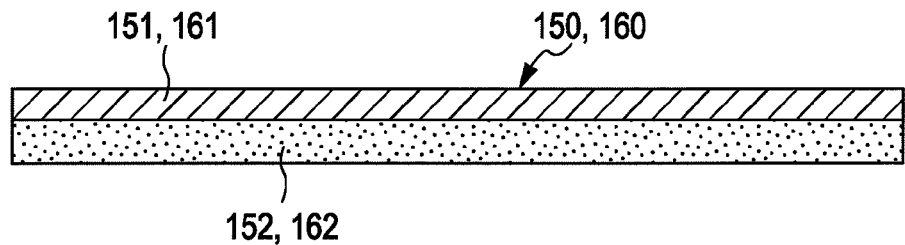
FIGS. 13A and 13B are sectional views illustrating further examples of an electromagnetic shielding film used in the electromagnetic shielding method according to the fourth embodiment of the present invention.
Figure 13B:
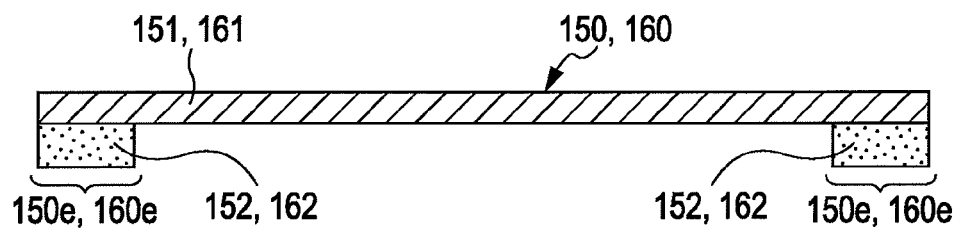

Therefore, therefore, when the conductors likely to be in contact with the electromagnetic shielding films 150 and 160 are absent from the electromagnetic shield regions, each of the electromagnetic shielding films 150 and 160 may include two layers, not the three layers, as shown in FIGS. 13A and 13B.

In other words, as shown in a sectional view of FIG. 13A, the electromagnetic shielding film 150 (or 160) may include a laminate of the conductive metal layer 151 (or 161) and the conductive adhesive layer 152 (or 162).

Further, as shown in a sectional view of FIG. 13B, the conductive adhesive layer 152 (or 162) may be laminated only on the peripheral portion of the conductive metal layer 151 (or 161).

Like in the above-described example, the electromagnetic shielding films 150 and 160 shown in FIGS. 13A and 13B are usually adhered to release paper with the conductive adhesive layers 152 and 162, respectively, and are thus used after the release paper is separated.

<Modified Example 2 of Fourth Embodiment (FIG. 14)>

As described above, the width d of the peripheral portions 150e and 160e in which the conductive adhesive layers 152 and 162 of the electromagnetic shielding films 150 and 160 are respectively exposed may correspond to a width slightly larger than the width of the upper end surfaces of the frame wall portions 131 and 141 of the conductive frame members 130 and 140. Namely, the shapes of the electromagnetic shielding films 150 and 160 may be slightly larger than the frame shapes of the conductive frame members 130 and 140, not precisely coincide with the frame shapes of the conductive frame members 130 and 140, respectively.

Figure 14:
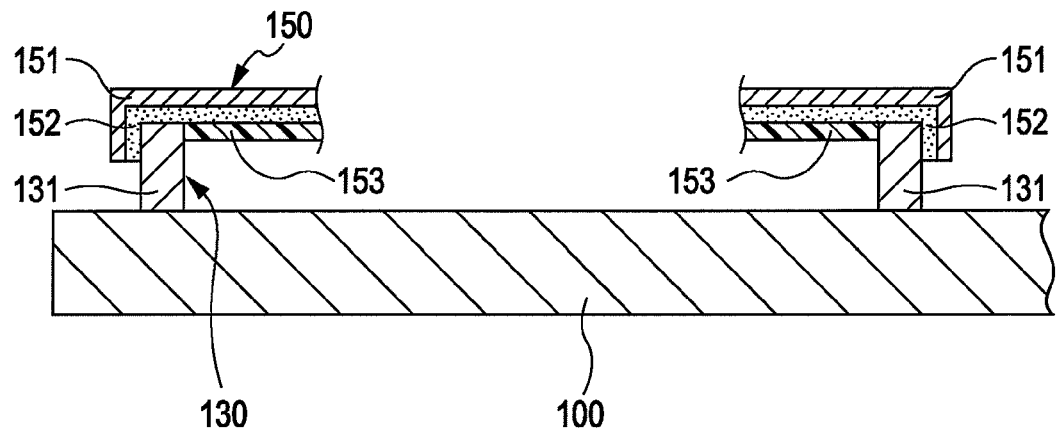
FIG. 14 is a sectional view illustrating a modified example of the electromagnetic shielding method according to the fourth embodiment of the present invention.

In this case, the ends of the peripheral portions 150e and 160e in which the conductive adhesive layers 152 and 162 of the electromagnetic shielding films 150 and 160 are respectively exposed project outward from the frame wall portions 131 and 141 of the conductive frame members 130 and 140, respectively. The end portions may be cut with a cutter or may be bonded to the outer side surfaces of the frame wall portions 131 and 141 of the conductive frame members 130 and 140, respectively, as shown in FIG. 14.

Consequently, adhesion and bonding property between the electromagnetic shielding films 150 and 160 and the conductive frame members 130 and 140, respectively, are enhanced.

<Advantage of Fourth Embodiment>

According to the fourth embodiment, the conductive frame members 130 and 140 are formed using molds, but the electromagnetic shielding films 150 and 160 are used in place of the cover members to be engaged with the conductive frame members 130 and 140, respectively. The electromagnetic shielding films 150 and 160 are formed at low cost as compared with the cover members formed using molds.

Therefore, according to the fourth embodiment, the cost is decreased as compared with the case of a can shield including a conductive frame member and a cover member formed using molds. Since the cost of forming the cover member made of a metal thin plate using a mold is usually higher than the cost of forming the conductive frame member using a mold, the cost in the fourth embodiment may be expected to be decreased to ½ or less of the cost of the can shield.

In addition, in the fourth embodiment, the electromagnetic shielding films are bonded to the upper ends of the frame wall portions 131 and 141 of the conductive frame members 130 and 140, respectively, not bonded directly to the respective grounding conductor patterns of the printed wiring board 100. Therefore, the electromagnetic shielding films are simply fixed to the printed wiring board 100 through the conductive frame members 130 and 140 without using a jig such as a thermocompression bonding bar or the like.

In addition, since the conductive frame members 130 and 140 are soldered to the printed wiring board 100, electromagnetic shielding may be more securely and strongly performed than in the case in which the electromagnetic shielding films are bonded directly to the respective grounding conductor patterns of the printed wiring board 100.

Further, in comparison with the first to third embodiments, the electromagnetic shielding films are easily separated from and again bonded to the respective electromagnetic shield regions of the printed wiring board 100, thereby facilitating change of electronic components in the electromagnetic shield regions.

Further, as shown in FIGS. 13A and 13B, the electromagnetic shielding film may be configured by the two layers including the conductive metal layer and the conductive adhesive layer without using the insulating resin layer, thereby realizing further thinning.

Further, in the fourth embodiment, the electromagnetic shielding films may be bonded to the respective conductive frame members at room temperature, thereby causing the effect of improving workability in comparison with the first to third embodiments.

In addition, in the modified example described with reference to FIG. 14, the shapes of the electromagnetic shielding films 150 and 160 may be slightly larger than the frame shapes of the conductive frame members 130 and 140, respectively, not precisely agree with the frame shapes. There is thus the advantage that the shapes of the electromagnetic shielding films 150 and 160 may be roughly formed. In addition, the portions of the electromagnetic shielding films 150 and 160 which project from the frames of the conductive frame members 130 and 140 may be adhered to the outer side surfaces of the frame wall portions 131 and 141 of the conductive frame members 130 and 140, respectively. There is thus the advantage of enhancing adhesion and bonding property between the electromagnetic shielding films 150 and 160 and the conductive frame members 130 and 140, respectively.

[Electromagnetic Shielding Method According to Fifth Embodiment (FIGS. 15A and 15B)]

In the fourth embodiment, it is desirable to prepare the electromagnetic shielding films 150 and 160 having shapes corresponding to the shapes of the electromagnetic shield regions 110 and 120, respectively, of the printed wiring board 100.

In the fifth embodiment, like in the fourth embodiment, conductive frame members with shapes corresponding to respective electromagnetic shield regions are used, but the electromagnetic shielding film 10 shown in FIG. 1A of the first embodiment is used as an electromagnetic shielding film.

In other words, in the fifth embodiment, the electromagnetic shielding methods according to the first and fourth embodiments are combined.

The electromagnetic shielding method according to the fifth embodiment is described by taking, for example, the electromagnetic shielding for the printed wiring board 100 described in the fourth embodiment.

First Step

The first step in the fifth embodiment is completely the same as in the fourth embodiment. Namely, conductive frame members 130 and 140 are disposed in electromagnetic shield regions 110 and 120, respectively, of a printed wiring board 100, and soldered to respective grounding conductor patterns.

In the fifth embodiment, the second step and subsequent steps are different from those in the fourth embodiment.

Second Step

In the fifth embodiment, the electromagnetic shielding film 10 of the above-described first embodiment is disposed to cover each of the electromagnetic shield regions 110 and 120 of the printed wiring board 100. In this case, as shown in FIG. 15A, the electromagnetic shielding film 10 is disposed so that the insulating resin layer 13 faces the printed wiring board 100 and the electromagnetic shielding film 10 projects outward from at least each of the frame wall portions 131 and 141 of the conductive frame members 130 and 140.

Third Step

Figure 15A:
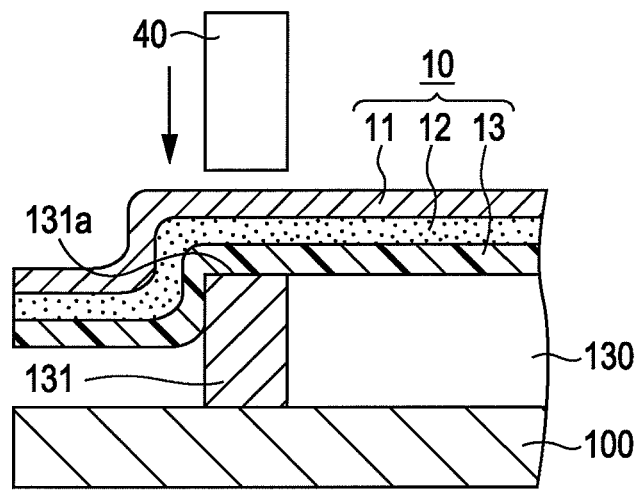
FIGS. 15A and 15B are drawings illustrating main steps of an electromagnetic shielding method according to a fifth embodiment of the present invention.

Next, as shown in FIG. 15A, the thermocompression bonding bar 40 heated to a predetermined temperature is pressed to the upper end surface of the frame wall portion 131 or 141 of the conductive frame member 130 or 140 on the printed wiring board 100 from the conductive metal layer 11 of the electromagnetic shielding film 10 by the same method as in the electromagnetic shielding method of the first embodiment described with reference to FIGS. 2A to 2C.

In this case, the third step may be first performed for the conductive frame member 130 in the electromagnetic shield region 110 and then performed for the conductive frame member 140. Alternatively, the third step may be simultaneously performed for both conductive frame members 130 and 140.

In this case, like in the first embodiment, the heating temperature of the thermocompression bonding bar 40 is higher than the melting temperatures of the insulating resin layer 13 and the conductive adhesive layer 12 and lower than the melting temperature of the conductive metal layer 11, for example, about 150° C. to 170° C.

As described with reference to FIGS. 2B and 2C, the thermocompression bonding bar 40 is provided to an arm 51 of a moving device 50. In the fifth embodiment, the thermocompression bonding bar 40 is automatically moved along the upper end surfaces of the frame wall portions 131 and 141 of the conductive frame members 130 and 140 on the basis of moving position setting information of an operator.

In this example, the moving device 50 is configured to store arrangement information of the upper end surfaces of the frame wall portions 131 and 141 of the conductive frame members 130 and 140 on the printed wiring board 100 so that the information is displayed on a display screen provided in the moving device 50. The operator determines a moving path of the thermocompression bonding bar 40 according to the arrangement information displayed on the display screen about the upper end surfaces of the frame wall portions 131 and 141 of the conductive frame members 130 and 140.

Then, the operator moves the thermocompression bonding bar 40 to the starting point of the set moving path and downwardly moves the thermocompression bonding bar 40 so as to press the conductive metal layer 11 of the electromagnetic shielding film 10 to the upper end surface 131a or 141a (141a not shown) of the frame wall portion 131 or 141 of the conductive frame member 130 or 140. At this time, the temperature of the thermocompression bonding bar 40 is controlled to about 150° C. to 170° C. by the heating device 52.

Then, the operator instructs the moving device 50 to start movement of the thermocompression bonding bar 40 along the set moving path. As a result, the moving device 50 moves the thermocompression bonding bar 40 so as to trace the upper end surface 131a or 141a (141a not shown) of the frame wall portion 131 or 141 of the conductive frame member 130 or 140 in a state in which the electromagnetic shielding film 10 is pressed to the upper end surface 131a or 141a (141a not shown) of the frame wall portion 131 or 141 of the conductive frame member 130 or 140.

When the thermocompression bonding bar 40 is moved, the insulating resin layer 13 is melted and contracted by heat in a portion of the electromagnetic shielding film 10 which is heated and pressed with the thermocompression bonding bar 40. Therefore, in the portion of the electromagnetic shielding film 10 which is heated and pressed with the thermocompression bonding bar 40, the insulating resin layer 13 is excluded by pressure of the thermocompression bonding bar 40, and the melted conductive adhesive layer 12 is bonded to the upper end surface 131a or 141a (141a not shown) of the frame wall portion 131 or 141 of the conductive frame member 130 or 140. Consequently, the conductive metal layer 11 of the electromagnetic shielding film 10 is electrically connected to the conductive frame member 130 or 140.

Therefore, the electromagnetic shielding film 10 is bonded to the conductive frame member 130 or 140 disposed on the printed wiring board 100 by trace-moving the thermocompression bonding bar 40, and the conductive metal layer 11 of the electromagnetic shielding film 10 is electrically connected to the grounding conductor pattern of the printed wiring board 100. As a result, electromagnetic shielding for the electromagnetic shield region 110 or 120 on the printed wiring board 100 is formed.

Fourth Step

Figure 15B:
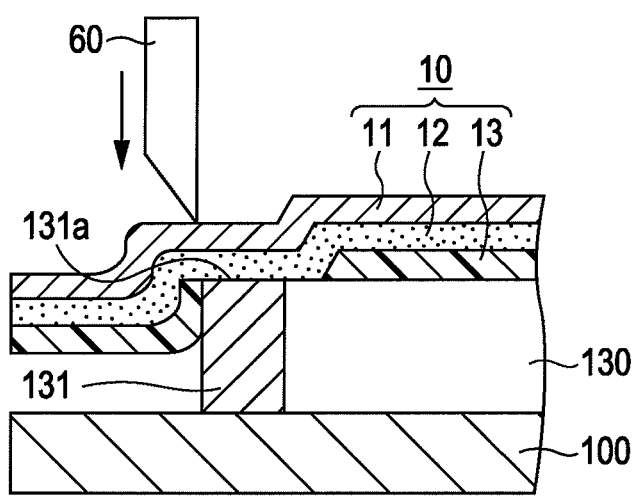

Next, in the fifth embodiment, as shown in FIG. 15B, a cutter 60 for cutting the electromagnetic shielding film 10 is attached to the arm 51 (refer to FIG. 3A) of the moving device 50 in place of the thermocompression bonding bar 40. In this case, the position of the arm 51 is finely controlled so that the edge of the cutter 60 is positioned outside a portion to be electromagnetically shielded, the portion being a bonded portion between the conductive metal layer 11 of the electromagnetic shielding film 10 and the frame wall portion 131 or 141 of the conductive frame member 130 or 140.

Then, the operator instructs the moving device 50 to move the cutter 60 downward so that the edge thereof is positioned at a cutting position of the electromagnetic shielding film 10 and move the cutter 60 to trace the frame wall portion 131 or 141 of the conductive frame member 130 or 140 like in the case of the thermocompression bonding bar 40. As a result, an excess portion of the electromagnetic shielding film 10 is cut off. Thus, electromagnetic shielding for the electromagnetic shield region of the printed wiring board 100 is completed.

In the fifth embodiment, the case using the electromagnetic shielding film 10 having the configuration shown in FIG. 1A is described. However, in the fifth embodiment, electromagnetic shielding may be realized using the electromagnetic shielding film 10S having the configuration shown in FIG. 1B.

In the description of the fifth embodiment, the step (third step) of connecting the conductive metal layer 11 of the electromagnetic shielding film 10 to each of the conductive frame members and the step (fourth step) of removing an excess portion of the electromagnetic shielding film 10 are separated from each other.

However, like in the first embodiment, the above-described two steps may be combined as one step by using a thermocompression bonding bar 70 with a cutter as shown in FIG. 4 in place of the thermocompression bonding bar 40.

When a portion other than the electromagnetic shield region 110 or 120 on the printed wiring board 100 may be covered with the electromagnetic shielding film 10 with no problem, the fourth step of cutting off an extra portion of the electromagnetic shielding film 10, which projects outward from the conductive frame member 130 or 140, may be omitted.

In the description of the fifth embodiment, the thermocompression bonding bar 40 is moved to trace the upper end surface of the frame wall portion 131 or 141 of the conductive frame member 130 or 140 so that the electromagnetic shielding film 10 or 10S is continuously bonded to the upper end surface of the frame wall portion 131 or 141 of the conductive frame member 130 or 140 with the conductive adhesive layer 12 of the electromagnetic shielding film 10 or 10S.

However, the thermocompression bonding bar 40 is pressed on the electromagnetic shielding film 10 at separate positions on the upper end surface of the frame wall portion 131 or 141 of the conductive frame member 130 or 140 so that the conductive metal layer 11 of the electromagnetic shielding film 10 is bonded and electrically connected to the upper end surface of the frame wall portion 131 or 141 of the conductive frame member 130 or 140 at the separate positions.

[Electromagnetic Shielding Method According to Sixth Embodiment (FIGS. 16A and 16B)]

In the above-described fifth embodiment, the electromagnetic shielding film 10 or 10S is bonded to the upper end surface of each of the frame wall portions 131 and 141 of the conductive frame members 130 and 140. However, the electromagnetic shielding film 10 may be bonded to the peripheral side surface of each of the frame wall portions 131 and 141. This case corresponds to the sixth embodiment.

Figure 16A:
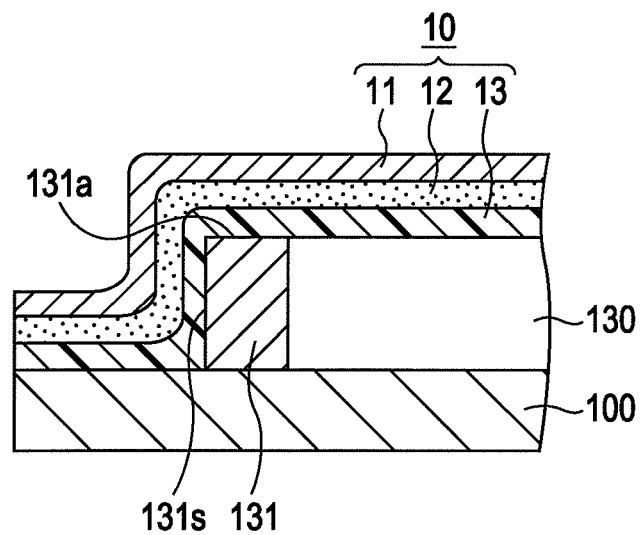
FIGS. 16A and 16B are drawings illustrating main steps of the electromagnetic shielding method according to the fifth embodiment of the present invention.

In the sixth embodiment, the first and second steps are completely the same as in the fifth embodiment. At the time when the second step is completed, a state shown in FIG. 16A is produced by the same method as in the fifth embodiment shown in FIGS. 15A and 15B.

In the sixth embodiment, in the next third step, a thermocompression bonding bar 90 with a cutter is attached to the moving device 50 (refer to FIG. 4). Then, the electromagnetic shielding film 10 is cut with the cutter edge by pressing the thermocompression bonding bar 90 with a cutter against the peripheral side surface 131s or 141s (141s not shown) of the frame wall portion 131 or 141 of the conductive frame member 130 or 140 under heating with the heating device 52.

At this time, the temperature of the thermocompression bonding bar 90 with a cutter is controlled to about 150° C. to 170° C. by the heating device 52.

Then, the operator instructs the moving device 50 to start movement of the thermocompression bonding bar 90 with a cutter along the set moving path. As a result, the moving device 50 moves the thermocompression bonding bar 90 with a cutter along the peripheral side surface 131s or 141s (141s not shown) of the frame wall portion 131 or 141 in a state in which the electromagnetic shielding film 10 is pressed to the peripheral side surface 131s or 141s (141s not shown) of the frame wall portion 131 or 141 of the conductive frame member 130 or 140.

When the thermocompression bonding bar 90 with a cutter is moved, the insulating resin layer 13 is melted and contracted by heat in a portion of the electromagnetic shielding film 10 which is heated and pressed with the thermocompression bonding bar 90 with a cutter. Therefore, in the portion of the electromagnetic shielding film 10 which is heated and pressed with the thermocompression bonding bar 90 with a cutter, the insulating resin layer 13 is excluded by pressure of the thermocompression bonding bar 90 with a cutter, and the melted conductive adhesive layer 12 is bonded to the peripheral side surface 131s or 141s (141s not shown) of the frame wall portion 131 or 141 of the conductive frame member 130 or 140. Consequently, the conductive metal layer 11 of the electromagnetic shielding film 10 is electrically connected to the conductive frame member 130 or 140.

Therefore, the electromagnetic shielding film 10 is bonded to the conductive frame member 130 or 140 mounted on the printed wiring board 100 by trace-moving the thermocompression bonding bar 90 with a cutter, and the conductive metal layer 11 of the electromagnetic shielding film 10 is electrically connected to the grounding conductor pattern of the printed wiring board 100. As a result, electromagnetic shielding is formed for the electromagnetic shield region 110 or 120 of the printed wiring board 100.

In this case, the third step may be first performed for the conductive frame member 130 in the electromagnetic shield region 110 and then performed for the conductive frame member 140. Alternatively, the third step may be simultaneously performed for both the conductive frame members 130 and 140.

Although, in the above-described sixth embodiment, bonding of the electromagnetic shielding film 10 to the conductive frame member and cutting of an excess portion are performed simultaneously, both may be performed in separate steps like in the fifth embodiment.

Figure 16B:
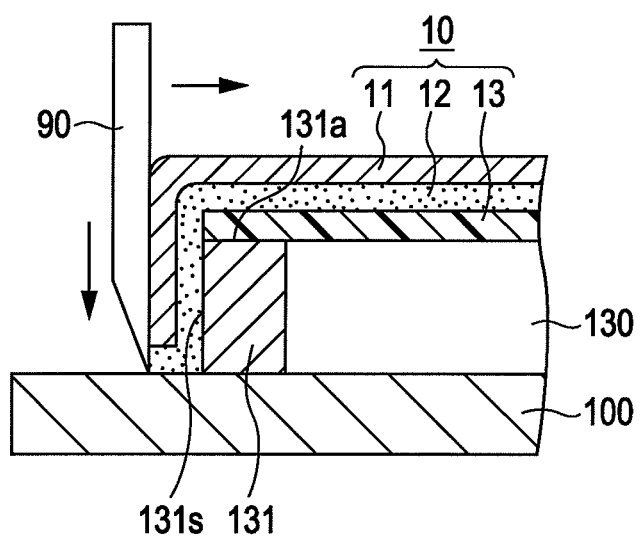

In addition, in the example shown in FIG. 16B, the electromagnetic shielding film 10 is cut on the printed wiring board 100. However, the edge of the cutter may be disposed in contact with the peripheral side surface of the frame wall portion 131s or 141s of the conductive frame member 130 or 140 so that the electromagnetic shielding film 10 is cut on the peripheral side surface of the frame wall portion 131s or 141s of the conductive frame member 130 or 140.

In addition, in the sixth embodiment, the use of the electromagnetic shielding film 10 having the configuration shown in FIG. 1A is described. However, in the fifth embodiment, electromagnetic shielding may be realized using the electromagnetic shielding film 10 having the configuration shown in FIG. 1B.

In the sixth embodiment, the electromagnetic shielding film may be bonded to not only the peripheral side surface of the frame wall portion of the conductive frame member but also the upper end surface of the frame wall portion.

[Other Embodiments]

In the fourth embodiment, the electromagnetic shielding films 150 and 160 are previously prepared to have shapes precisely coinciding with the shapes of the respective electromagnetic shield regions. However, in the fourth embodiment, the electromagnetic shielding films may be roughly formed by providing the cutting step of the fifth embodiment.

In other words, the electromagnetic shielding films 150 and 160 may be formed to shapes slightly larger than the frame shapes of the conductive frame members 130 and 140 corresponding to the electromagnetic shield regions 110 and 120, respectively. In this case, the electromagnetic shielding films 150 and 160 are bonded to the upper end surfaces of the frame wall portions 131 and 141 of the conductive frame members 130 and 140, respectively, and then projecting portions of the electromagnetic shielding films 150 and 160 are cut with the cutter.

In this case, when conductors likely to be in contact with the electromagnetic shielding films are absent from the electromagnetic shield regions 110 and 120, two-layer electromagnetic shielding films each including the conductive metal layer and the conductive adhesive layer may be used.

In addition, the idea of the bonding portion and the idea of cutting of an extra portion in the sixth embodiment may be applied to the fourth embodiment.

Namely, the electromagnetic shielding films 150 and 160 are formed to shapes slightly larger than the frame shapes of the conductive frame members 130 and 140 corresponding to the electromagnetic shield regions 110 and 120, respectively. In this case, portions projecting from the upper end surfaces of the frame wall portions 131 and 141 of the conductive frame members 130 and 140 are adhered to the peripheral side surfaces of the frame wall portions 131 and 141 of the conductive frame members 130 and 140.

Then, extra portions of the electromagnetic shielding films are cut with the cutter by the same method as in the sixth embodiment.

In this case, when conductors likely to be in contact with the electromagnetic shielding films are absent from the electromagnetic shield regions 110 and 120, two-layer electromagnetic shielding films each including the conductive metal layer and the conductive adhesive layer may be used.

In this embodiment, like in the fourth embodiment, a conductive adhesive layer which is bondable at room temperature may be used for each of the electromagnetic shielding films. Therefore, unlike in the fifth and sixth embodiments, the thermocompression bonding step is not performed.

In addition, the electromagnetic shielding films 150 and 160 are not precisely positioned on the conductive frame members 130 and 140, respectively, thereby causing the effect of simplifying the work as compared with the fourth embodiment.

In the fourth embodiment, each of the electromagnetic shielding films is bonded to the conductive frame member with the conductive adhesive layer exposed in at least the peripheral portion of the electromagnetic shielding film. However, grounding conductor patterns may be formed to surround the respective electromagnetic shield regions 110 and 120 so that the electromagnetic shielding films 150 and 160 are bonded to the respective grounding conductor patterns with the conductive adhesive layers in the peripheral portions.

In this case, the insulating layer may be provided or not provided according to the conditions in the electromagnetic shield regions.

Although, in the above description, the conductive frame members are made of a conductive metal, the material is not limited to the conductive metal as long as the conductive frame members are composed of a conductive material.

The present application contains subject matter related to those disclosed in Japanese Priority Patent Application JP 2009-123715 filed in the Japan Patent Office on May 22, 2009, 2009-138978 filed in the Japan Patent Office on Jun. 10, 2009, and 2009-262700 filed in the Japan Patent Office on Nov. 18, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electromagnetic shielding method comprising the steps of:
    disposing a flexible electromagnetic shielding film including a laminate of at least an insulating layer and a conductive metal layer to cover a portion to be electromagnetically shielded on a printed wiring board so that the insulating layer faces the printed wiring board, the conductive metal layer having a higher melting temperature than that of the insulating layer;
    heating the electromagnetic shielding film to a temperature to melt and contract the insulating layer, thereby bonding the conductive metal layer to a grounding conductor of the printed wiring board and electrically connecting the conductive metal layer to the grounding conductor, the heating temperature being higher than the melting temperature of the insulating layer and lower than the melting temperature of the conductive metal layer; and
    cutting an excess portion of the electromagnetic shielding film outside a bonded portion between the conductive metal layer and the grounding conductor.

2. The electromagnetic shielding method according to claim 1,
    wherein the electromagnetic shielding film further includes a conductive adhesive layer provided between the insulating layer and the conductive metal layer, the melting temperature of the conductive adhesive layer being lower than that of the conductive metal layer;
    the heating temperature of the electromagnetic shielding film is higher than the melting temperatures of the insulating layer and the conductive adhesive layer and lower than the melting temperature of the conductive metal layer; and
    the conductive metal layer is bonded and electrically connected to the grounding conductor of the printed wiring board through the melted conductive adhesive layer.

3. The electromagnetic shielding method according to claim 1,
    wherein the electromagnetic shielding film is heated while being pressure-bonded to the grounding conductor of the printed wiring board from the conductive metal layer side using a thermocompression bonding bar to melt and contract the insulating layer, thereby bonding the conductive metal layer to the grounding conductor.

4. The electromagnetic shielding method according to claim 1,
    wherein the electromagnetic shielding film is heated while being pressure-bonded to the grounding conductor of the printed wiring board from the conductive metal layer side using a thermocompression bonding bar with a cutter to melt and contract the insulating layer, thereby bonding the conductive metal layer to the grounding conductor and cutting off the excess portion of the electromagnetic shielding film outside the bonded portion between the conductive metal layer and the grounding conductor.

5. The electromagnetic shielding method according to claim 1,
wherein a grounding conductor pattern is provided on the printed wiring board so as to surround the portion to be electromagnetically shielded; and
a current is passed through the grounding conductor pattern to melt and contract the insulating layer by Joule heat generated in the grounding conductor pattern, thereby bonding the conductive metal layer to the grounding conductor.

6. The electromagnetic shielding method according to claim 1,
wherein the electromagnetic shielding film is bonded to the printed wiring board to leave an unbonded portion; and
the unbonded portion is used as an opening through which air between the printed wiring board and the electromagnetic shielding film is sucked to close the opening by bonding.

\* \* \* \* \*